(12) United States Patent
Arndt et al.

(10) Patent No.: US 6,278,171 B2
(45) Date of Patent: Aug. 21, 2001

(54) SUBLITHOGRAPHIC FUSES USING A PHASE SHIFT MASK

(75) Inventors: Kenneth C. Arndt; Louis L. Hsu, both of Fishkill; Jack A. Mandelman, Stormville; K. Paul Muller, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/734,668

(22) Filed: Dec. 13, 2000

Related U.S. Application Data

(62) Division of application No. 09/224,768, filed on Jan. 4, 1999, now Pat. No. 6,190,986.

(51) Int. Cl.[7] .................................................. H01L 29/00
(52) U.S. Cl. ..................... 257/529; 257/530; 257/281; 257/282; 257/173
(58) Field of Search .................................. 257/529, 530, 257/173, 281, 282; 438/601, 467, 381, 947, 570

(56) References Cited

U.S. PATENT DOCUMENTS

| | | | |
|---|---|---|---|
| 4,064,493 | 12/1977 | Davis | 257/529 |
| 4,597,162 | 7/1986 | Johnson et al. | 438/16 |
| 4,679,310 | 7/1987 | Ramachandra et al. | 438/570 |
| 4,682,204 | 7/1987 | Shiozaki et al. | 257/529 |
| 4,984,054 | 1/1991 | Yamada et al. | 257/529 |
| 5,066,998 | 11/1991 | Fischer et al. | 257/529 |
| 5,244,836 | 9/1993 | Lim | 438/601 |
| 5,420,456 | 5/1995 | Galbi et al. | 257/529 |
| 5,472,901 | * 12/1995 | Kapoor | 438/601 |
| 5,672,905 | 9/1997 | Lee et al. | 257/665 |
| 6,015,991 | 1/2000 | Wheeler et al. | 257/336 |

FOREIGN PATENT DOCUMENTS

| | | |
|---|---|---|
| 57-145357 | 9/1982 | (JP) . |
| 61-147548 | 7/1986 | (JP) . |
| 1-295440 | 11/1989 | (JP) . |
| 6-77180 * | 3/1994 | (JP) . |

\* cited by examiner

*Primary Examiner*—Olik Chaudhuri
*Assistant Examiner*—Dilinh Nguyen
(74) *Attorney, Agent, or Firm*—McGinn & Gibb, PLLC; Todd M. C. Li

(57) ABSTRACT

A method for forming an interconnect wiring structure, such as a fuse structure, comprises forming an opening in an insulating layer using a phase shift mask (the opening having vertical sidewalls sloped sidewalls and horizontal surfaces), depositing a conductive material in the opening and removing the conductive material from the sloped sidewalls and horizontal surfaces, wherein the conductive material remains on the vertical sidewalls as fuse links.

5 Claims, 6 Drawing Sheets

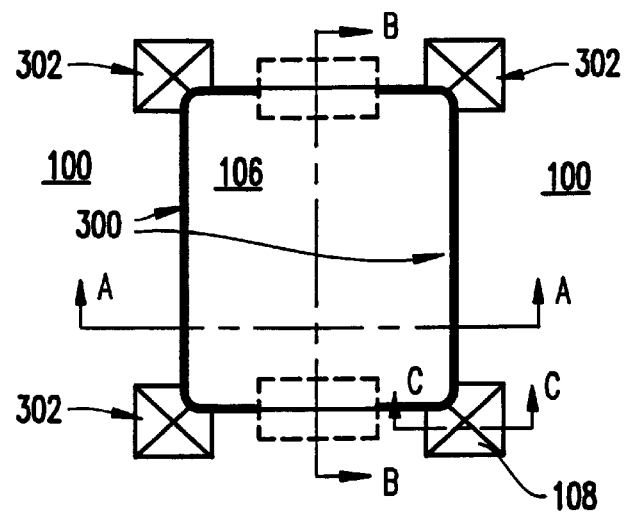
FIG.3A
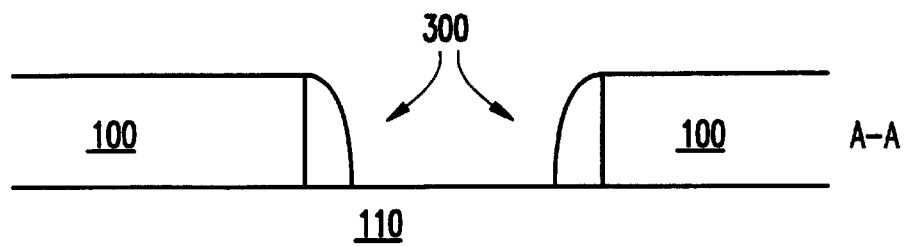
FIG.3B  A-A
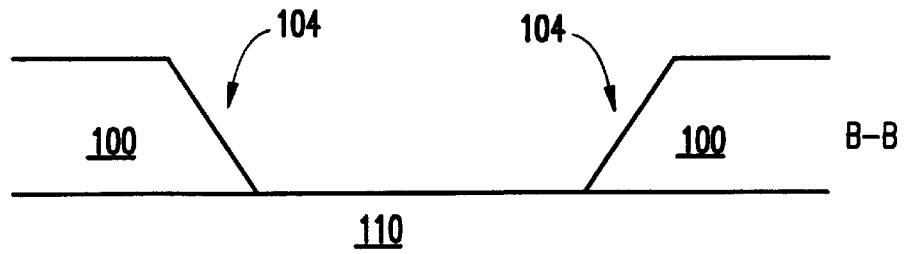
FIG.3C  B-B
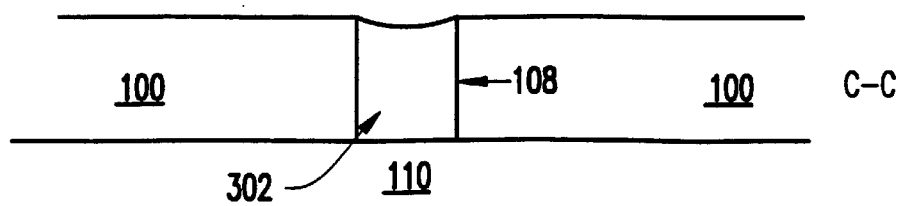
FIG.3D  C-C under US 6,278,171 B2

SUBLITHOGRAPHIC FUSES USING A PHASE SHIFT MASK

CROSS-REFERENCE TO RELATED APPLICATIONS

This application is a division of U.S. application Ser. No. 09/224,768 filed Jan. 4, 1999 U.S. Pat. No. 6,190,986.

BACKGROUND OF THE INVENTION

1. Field of the Invention

The present invention generally relates to wiring, such as fuses, in semiconductor devices such as dynamic random access memories (DRAMs) and, more specifically, to fuses which can be opened using lower voltages and currents.

2. Description of the Related Art

Dynamic random access memory (DRAM) development technology has recently moved past 256 Mb to 1 Gb. Other technologies are similarly increasing the size of components and the density of components on a given semiconductor chip.

The increase in density on a given chip and the increase in chip size increases the chance of defects within a given product. Therefore, it is very important to include redundant components which can be easily substituted for defective components, using selectively blowable fuses. While some redundancy repair techniques only allow wafer level repair, electrically blowable fuses allow redundant modules within a wafer to replace defective modules on the same wafer.

The key elements important in producing robust and viable electric fuses include ease of use, ability to fabricate the fuse using existing processes and the ability to reliably use a laser to selectively open the fuses. One of the most important parameters in determining the efficiency of an electrical fuse design is the amount of effort it takes to blow ("delete" or "open") the fuse and maintain the open condition during the fuse's operating life.

Creating a fuse link with a high resistance and increased current density allows the fuse to be blown more easily for a constant input current. Resistive heating generally causes the fuse link material to melt, causes a phase change of the fuse material to a non-conductive state, or causes the fuse material to move away from the fuse link location to prevent the possibility of continued conduction through a blown fuse.

The invention increases the performance of such fuses through a simplified method of forming fuses which are very small (having sub-lithographic feature sizes) and which, therefore, have increased current density.

SUMMARY OF THE INVENTION

It is, therefore, an object of the present invention to provide a self-trimming wiring, such as a fuse structure, and method for forming the same comprising forming a pattern in a photoresist layer by exposure through a phase shift mask over an insulating layer, forming an opening in the insulating layer using the phase shift mask (the opening having vertical sidewalls and sloped sidewalls), depositing a conductive material in the opening, on the vertical sidewalls and on the sloped sidewalls, removing the conductive material from the sloped sidewalls and horizontal surfaces of the opening, wherein the conductive material remains on the vertical sidewalls as fuse links.

The process of forming the opening includes forming the opening to have a minimum lithographic size and the fuse links have a size smaller than the minimum lithographic size. The process of forming the phase shift mask includes forming the phase shift mask to have narrow aperture regions for forming the vertical sidewalls and wide aperture regions for forming the sloped sidewalls. The process of removing the conductive material comprises reactive ion etching. The process of forming the opening includes forming pad areas and the fuse links selectively connect ones of the pad areas. The process of forming the opening forms the vertical sidewalls continuously between ones of the pad areas that are connected and forms the sloped sidewalls between ones of the pad areas that are not connected. The method also includes selectively blowing ones of the fuse links to disconnect elements connected by the fuse links.

BRIEF DESCRIPTION OF THE DRAWINGS

The foregoing and other objects, aspects and advantages will be better understood from the following detailed description of preferred embodiments of the invention with reference to the drawings, in which:

FIGS. 3A–3D are schematic illustrations of the structure shown in

FIGS. 2A–2D with the inventive fuse link formed therein;

DETAILED DESCRIPTION OF REFERRED EMBODIMENTS OF THE INVENTION

As discussed above, an important feature of a selectively blowable fuse is having a high resistance fuse link that is easily and consistently blown. As the cross-section of the fuse link decreases, the current density traveling within the fuse link increases, for the same applied current. This current crowding within the fuse link increases the heat generated and causes the fuse link to open. The invention produces fuse links with extremely small cross-sectional areas (sublithographic fuses links) by utilizing sub-lithographic sidewall spacer formation processes in the fuse link formation. Such fuses have very high resistance values and are easily and consistently blown.

Figure 1A:
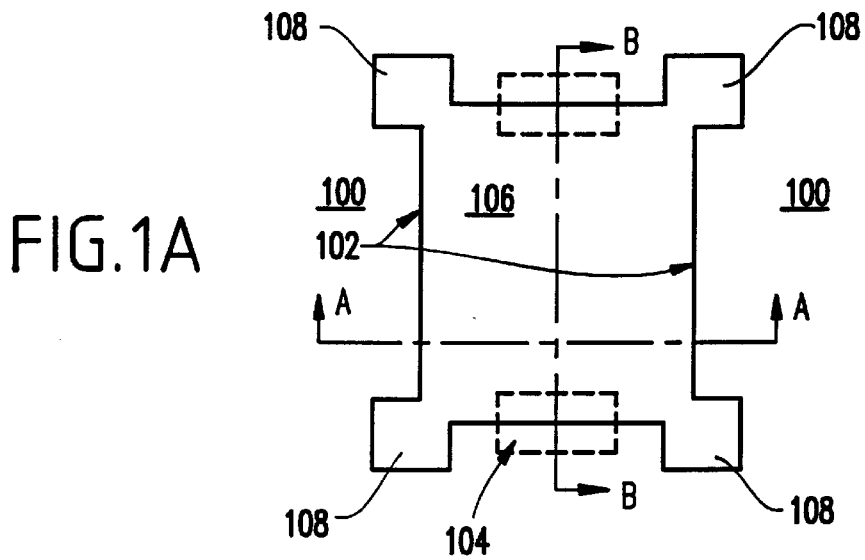
FIGS. 1A–1C are schematic illustrations of an insulating layer and substrate shaped according to the invention.
Figure 1B:
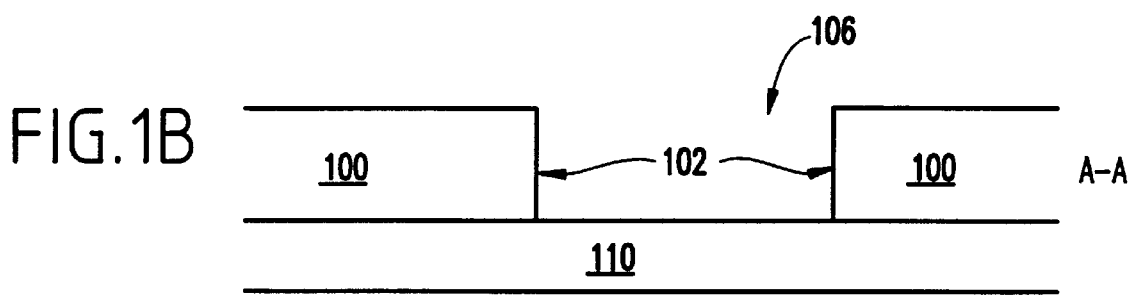
Figure 1C:
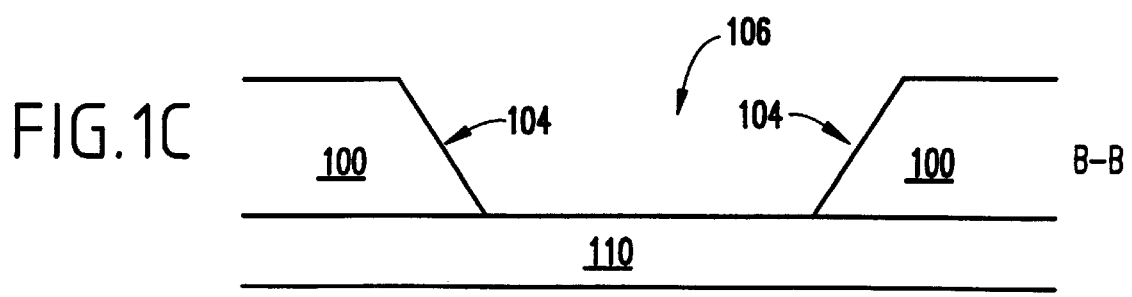
Figure 2A:
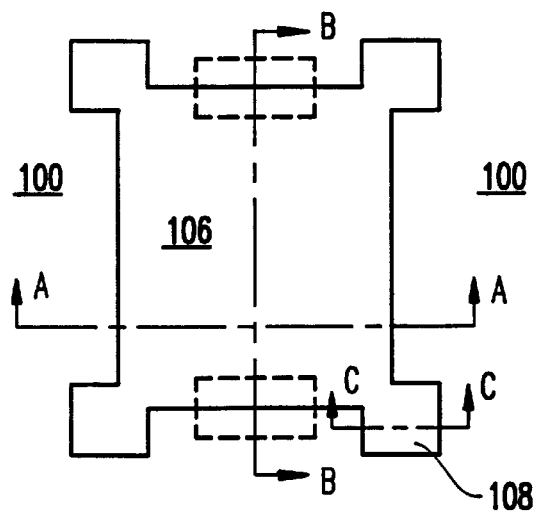
FIGS. 2A–2D are schematic illustrations of the structure shown in FIGS. 1A–1C having a conductor material applied thereto.
Figure 2B:
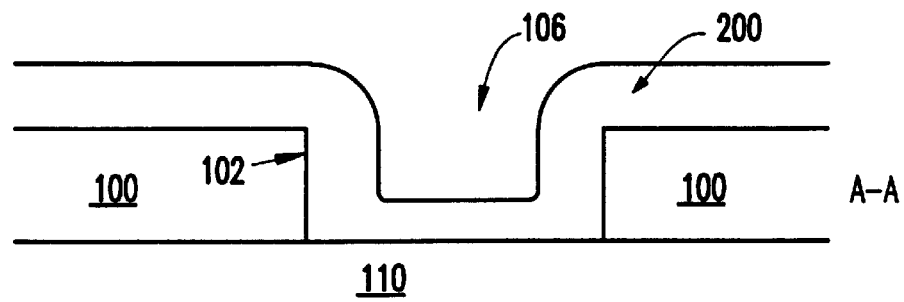
Figure 2C:
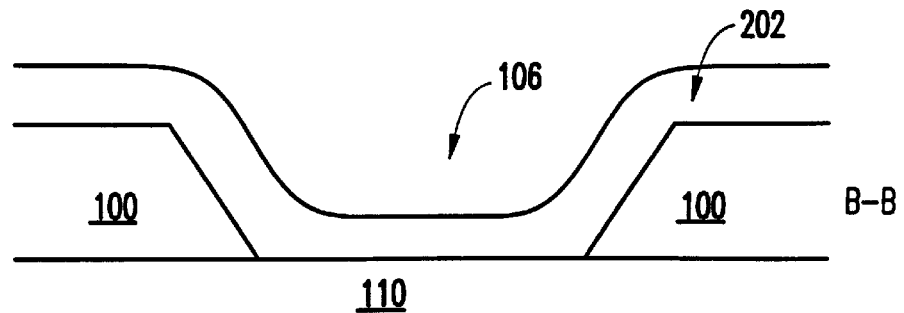
Figure 2D:
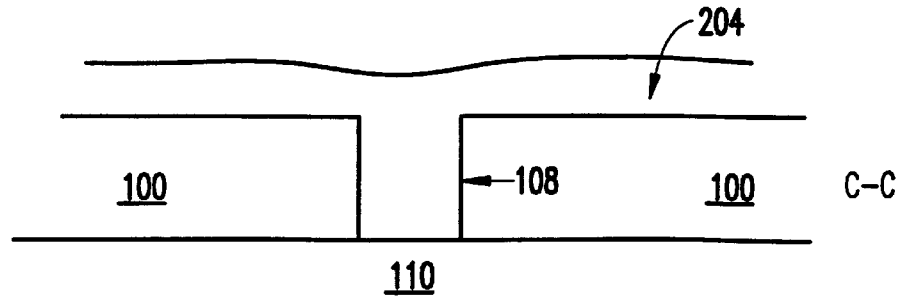

More specifically, as illustrated in FIG. 1A, an opening 106 is formed in an insulation layer 100. The opening 106 includes vertical sidewalls 102 and sloped sidewalls 104. The vertical sidewalls 102 and sloped sidewalls 104 are also illustrated in FIGS. 1B–1C. The insulating layer is preferably positioned above an insulating layer 110, as illustrated in FIGS. 1B–1C.

The structure illustrated in FIGS. 1A–1C is formed using a single phase shift mask, which is discussed in greater detail below with reference to FIGS. 4A–5C. The phase shift mask includes wide aperture regions which form the sloped sidewall regions 104 and narrow aperture regions which form the steep sidewalls 102. The mask is shaped to form the opening 106 shown in FIG. 1A and also defines the pad areas 108 which will eventually connect with higher levels of wiring.

A conductive material is deposited in the opening 106 as illustrated in FIGS. 2A–2D. More specifically, a conductive material 200, such as a metal, alloy, semiconductor, or polysilicon material is deposited in the opening 106 using common conformal deposition methods, such as sputtering, chemical vapor deposition, physical vapor deposition, or liquid deposition. The conductive material is selected to have flow characteristics such that it will conform to and line the openings 200, 202 and fill the pad areas 204.

After the conductive material 200 is deposited, the structure is subject to a anisotropic reactive ion etch (RIE). The reactive ion etch selectively removes the conductive material 200 from horizontal and sloped surfaces and allows the conductive material 200 to remain on vertical surfaces. Therefore, the conductive material remains on the vertical sidewalls 102 as a fuse link material 300, as shown in FIGS. 3A–3B. Similarly, the conductive material remains on the vertical walls of and fills in the pad areas 108 to become contact pads 302, as illustrated in FIGS. 3A and 3D. However, the conductive material 200 is removed from the top of the insulating layer 100, from the insulating layer 110 along the bottom of the opening 106 and from the sloped sidewall portions 104 of the opening 106 by the reactive ion etch. Therefore, the invention forms fuse links 300, which selectively connect different ones of the contract pads 302, as sidewall spacers of the opening 106.

Additionally, the opening 106 can have a minimum lithographic size. For purposes of this application, minimum lithographic size is equal to the smallest feature which can be formed with conventional lithographic techniques. Lithographic techniques selectively pattern surfaces. For example, a common lithographic technique is photolithography which involves exposing a pattern on a photosensitive mask or material and removing portions of the mask (e.g., positive or negative resists) to expose the patterns. The smallest lithographic feature does not have a specific size because the art of lithography continues to advance resulting in smaller and smaller minimum lithographic features with each new advance in the technology.

The fuse links 300 have a sub-lithographic size (e.g., a size smaller than the smallest possible lithographic feature). As discussed above, the very small cross-sectional area of the fuse links 300 allows increased current crowding and, therefore, the fuse can be blown more easily and more predictably. For example, the fuse links preferably have a cross-sectional width within the range of 50 to 150 nm, which could be electrically blown with a voltage in the range of 2.5 to 6V.

Figure 4A:
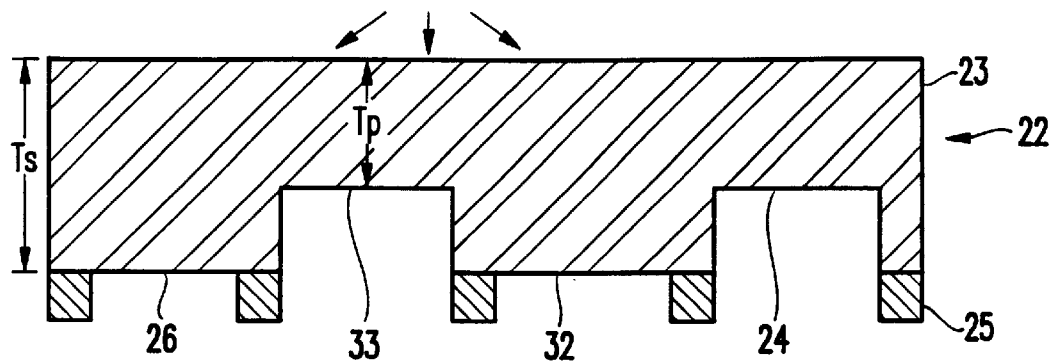
FIGS. 4A–4C illustrate a photolithographic process of simultaneously forming vertical sidewalls and sloped sidewalls.

Referring to FIG. 4A, the phase-shift mask of the invention is shown generally as 22. The mask 22 comprises a transparent substrate 23 having a thickness Ts. The substrate 23 has light shielding material 25 thereon in the form of parallel lines. Channels 24 reduce the thickness of substrate 23 as represented by Tp. The thickness of the substrate Ts at surface 26 is therefore greater than the thickness of the substrate at channel 24 (Tp) and light transmitted through mask 22 has a different phase on each side 32 and 33 of light shielding material 25. The mask may be generally described as having light shielding areas 25 between areas 32,33 providing a difference in phase for the light passing through the mask. As would be well-known to those ordinarily skilled in art given this disclosure, other methods may be used to change the phase of the light transmitted through the mask 22 such as the use of a phase shifter material such as Spin On Glass (SOG) in place of the channel 24.

Figure 4B:
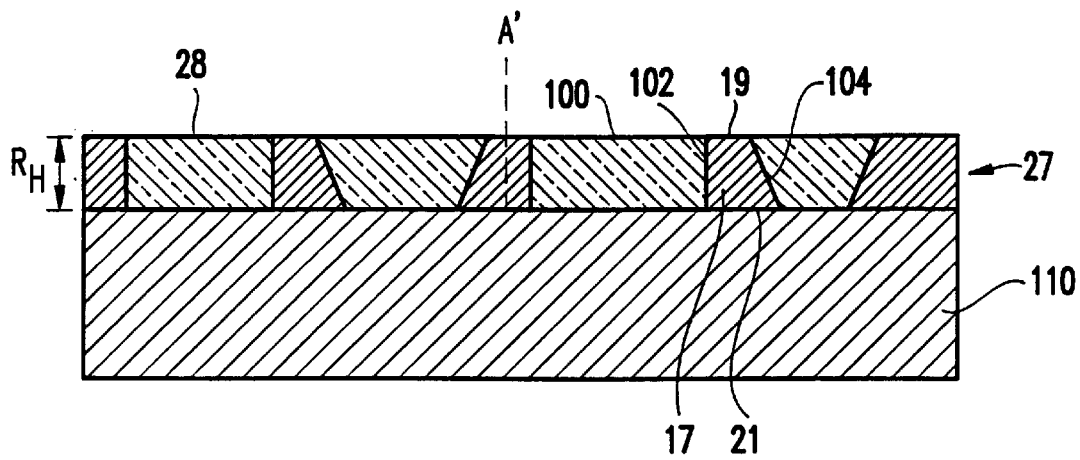
Figure 4C:
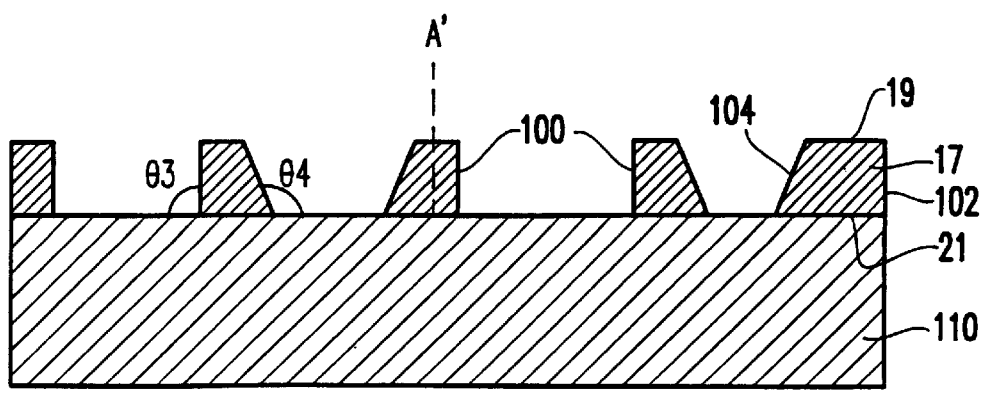

Referring to FIGS. 4A, 4B and 4C a method is shown for using the inventive phase shift mask of the invention to form the substrate having asymmetric resist pattern thereon, which is illustrated in the previous Figures. In FIG. 4A light is shown impinging on mask 22 of the invention which comprises a transparent substrate 23 having a surface 26 having light shielding lines 25 thereon and channel areas 24 so that the phase of the light traveling through mask 22 is different on each side 32 and 33 of light shielding material 25.

FIG. 4B shows the structure generally as 27 comprising the substrate 110 coated with a positive photoresist insulating material 100 having a thickness $R_H$. Resist patterns 17 are formed having the vertical sidewalls 102 and sloped sidewalls 104, discussed above, base 21 and top 19. Exposed resist is shown as 28 and when developed is soluble and is removed forming the resist pattern substrate shown in FIG. 4C.

FIGS. 4A–4C do not necessarily illustrate the entire fuse structure shown in FIGS. 1A–2D. Instead, FIGS. 4A–4C (and FIGS. 5A–5C, discussed below) illustrate that the vertical and sloped sidewalls can be simultaneously formed in a single photolithographic process using a phase shift mask, to achieve the advantages of the invention. One ordinarily skilled in the art would be able to form the structure shown in FIGS. 1A-2D using the information disclosed by FIGS. 4A–5C.

As can be seen from FIG. 4C, angle θ3 is different from angle θ4 forming an asymmetric resist pattern 17 having asymmetric sidewalls 102, 104. A vertical line A' bisecting base 21 of resist pattern 17 shows an asymmetric cross-section of the resist over the height of the resist. The resist is skewed on the side of the light shielding material having the phase shift means. The intensity profile of the light through the mask of the invention at the top of the resist in FIG. 4B is slightly asymmetric about midpoint A'. The asymmetry of the light intensity profile about midpoint A' is more pronounced at the base of the resist due to the finite thickness of the resist. A prior art mask (non-phase shift mask) would have a symmetric intensity profile which may be substantially the same at the top of the resist and at the base of the resist.

The transparent material 23 may be any suitable transparent material such as glass, calcium fluoride and is preferably fused silica. The thickness of the substrate Ts can be any desired thickness and is preferably about 90 mils to 300 mils. It is preferable to create the phase shift of the light passing through the mask by employing channels 24 in the substrate 23. The phase of the light is shifted by its travel through a different substrate thickness (Ts versus Tp). The necessary thickness for a desired phase shift can be easily adjusted. The difference between the phases of the light passing through the mask substrate at 32 (e.g., wide aperture area) and the opposed side 33 (e.g., narrow aperture area) of light shielding material 25 must be other than 0° or 180°, or multiples thereof. In a preferred embodiment, the difference in phase of the light is 90° and multiples thereof. Thus, the light passing through point 32 is the light transmitted from the exposure apparatus end and the light passing through point 33 is phase shifted 90° or any other desired angle other than 0° or 180°, or multiples thereof.

The light shielding material 25 may be any suitable material such as molybdenum silicide and chrome and is typically chrome which is applied using conventional means such as sputtering or metal evaporation, preferably sputtering. The thickness of the light shielding material may vary widely and is preferably about 50 nm to 150 nm. The purpose of the light shielding material 25 is to prevent light from passing through the mask where the material 25 is present onto the resist coated substrate being imaged.

Referring again to FIG. 4B, the substrate 110 is typically silicon or other semiconductor, conductor, or insulating material and the insulating resist material 100 may be any insulating photoresist such as a negative resist or a positive resist. While any resist may be used, it is preferred that the resolution of the resist be a medium or high resolution resist as is well-known in the art.

It is an important feature of the invention that the resist, thickness of the resist, the difference in phase of the light on each side of the light shielding material, and the focus and light exposure dose during exposure be specially controlled either singly or preferably in combination to provide the desired asymmetric resist patterns of the invention. Each of the above parameters may be varied independently but are all preferably controlled within certain ranges to provide enhanced resist patterning results.

Any resist thickness (as shown as $R_H$ in FIG. 4B) may be employed, but it is preferred that greater thicknesses be used to provide a greater asymmetric resist pattern effect. For example, the resist thickness is about 0.1 $\mu$m to 10 $\mu$m and is preferably about 0.4 $\mu$m to 2 $\mu$m. The defocus may also vary widely and is generally greater than the thickness of the resist, generally up to about +10 $\mu$m and preferably about +1 $\mu$m. Also preferred is a positive defocus rather than a negative defocus. The exposure dose is important and is generally chosen to be such that the width of the printed line is substantially equal to the width of the corresponding mask pattern. For example, for a 5×stepper, a 2.0 $\mu$m mask feature will print a 0.4 $\mu$m width line. This is conventionally called "dose to size" and preferably, a dose of about 0.7 to 1.5 times the dose to size is preferred.

In a preferred embodiment, the illumination condition of the projection exposure tool would provide a coherency of about 0.25 to 0.8, preferably 0.6 or less.

Referring to FIGS. 4A–4C the resist pattern can be formed using a 365 nm (i-line) light with a 90° phase shift on one side of a 240 nm structure wafer with a positive tone resist of 0.85 $\mu$m thickness. A defocus of about –0.2 $\mu$m resulted in a substantially 90° profile on one side of the resist θ3 and a 105° profile on the other wall of the resist pattern θ4.

Figure 5A:
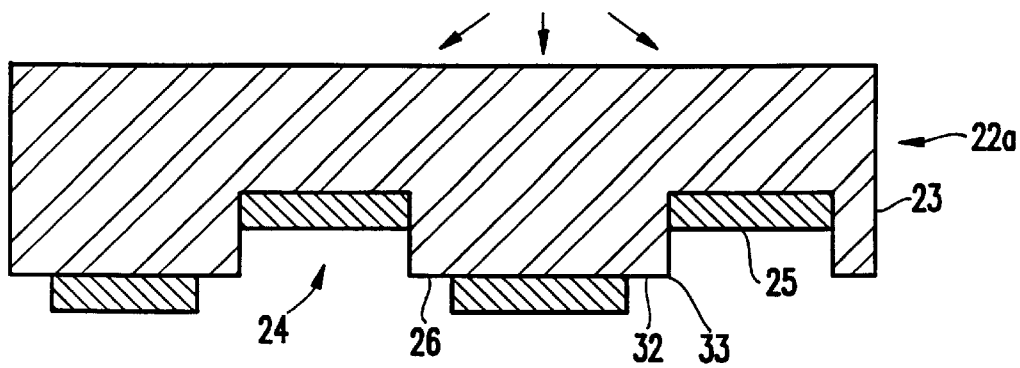
FIGS. 5A–5C illustrate a photolithographic process of simultaneously forming vertical sidewalls and sloped sidewalls.
Figure 5B:
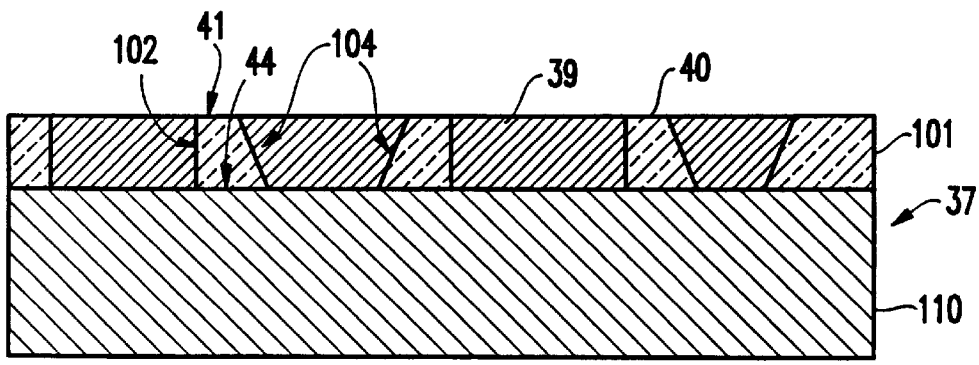
Figure 5C:
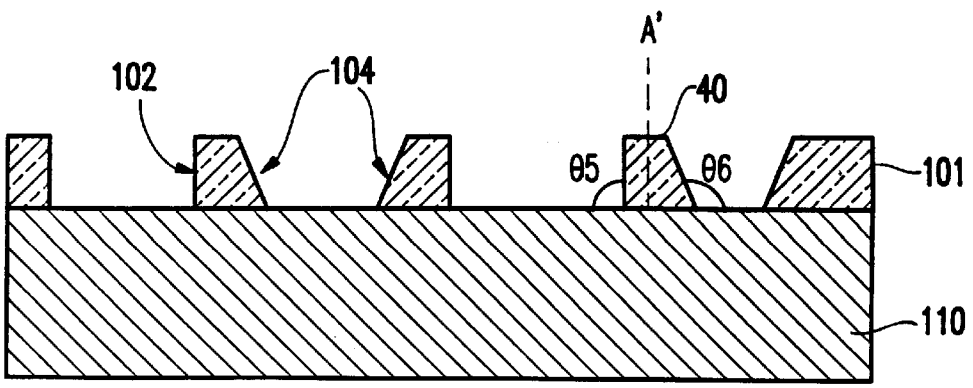

Referring to FIGS. 5A, 5B and 5C, the use of a mask and method of the invention is used to pattern a substrate coated with a negative resists. In FIG. 5A, mask 22a comprises a transparent substrate 23, light shielding members 25 and phase shifter channels 24. The surface of the substrate is shown as 26. Light passing through the mask is shown passing through the substrate without any phase shift as 32 and passing through channel 24 and being phase shifted as 33.

In FIG. 5B, the substrate 110 is coated with a negative insulating resist 101, shown generally as 37, is exposed to light and position 40 is made insoluble and the part not exposed to light 39, remains soluble. Exposed resist 40 has vertical sidewalls 102 and sloped sidewalls 104, a base 44 and top 41. After developing, as shown in FIG. 5C, the soluble portion 39 is removed leaving only the negative insulating resist 40. Similar to the structure shown in FIG. 4C, angle θ5 is different from angle θ6 forming an asymmetric resist pattern 40 as shown by vertical axis A'. As discussed above for FIGS. 4A, 4B and 4C, the phase shift mask of the invention produces an asymmetric light intensity profile on the resist and an asymmetric resist pattern. Non-phase shift masks would produce a symmetric light intensity profile and a symmetric resist pattern.

Figure 6:
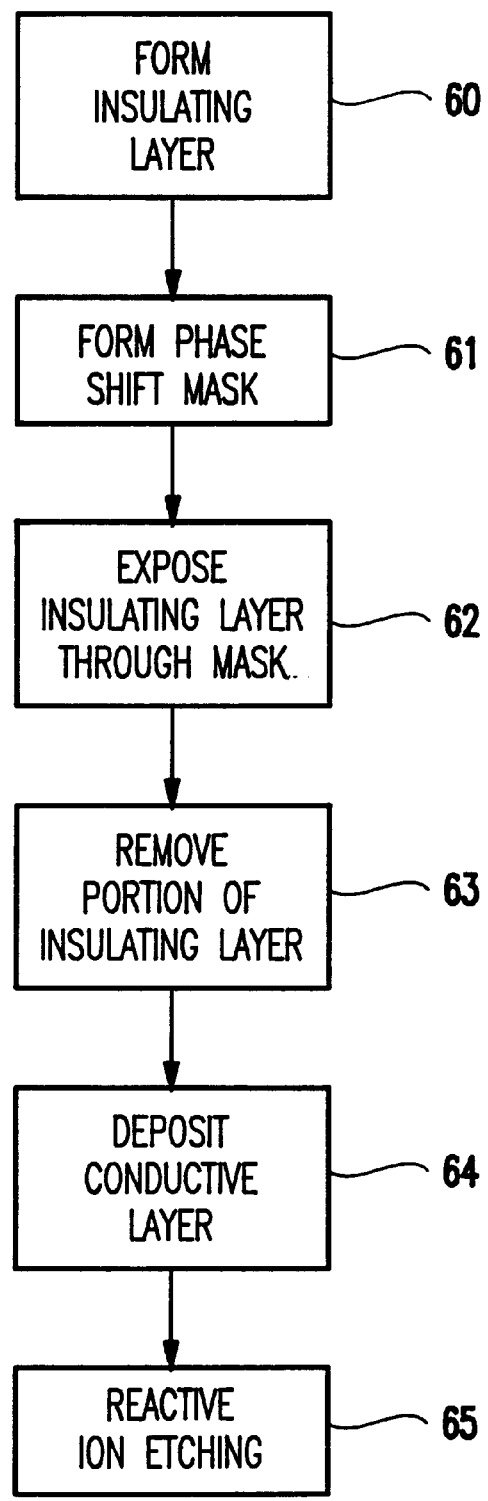
FIG. 6 is a flowchart illustrating a preferred embodiment of the invention.

FIG. 6 is a flowchart illustrating a preferred embodiment of the invention. More specifically, in block 60 a photoresist insulating layer 100 is formed above the insulating substrate layer 110. In block 61 the phase shift mask 22 is formed. In block 62 the insulating layer 100 is exposed using the phase shift mask 22 to simultaneously form the vertical sidewalls 102 and the sloped sidewalls 104. In block 63 the soluble portion of the resist 28, 39 is removed. In block 64 the conductive layer 200 is deposited within the opening 106. In block 65 the structure is subjected to a reactive ion etching which allows the fuse links 300 to remain on the vertical surfaces 102, 108 and to be removed from the sloped surfaces 104.

Thus, with the invention, a single mask 22 can be used to form fuse links having sub-lithographic sizes. Further, the single mask 22 is a phase shift mask which permits sloped walls 104 and vertical walls 102 to be simultaneously formed. As mentioned above, the sloped walls 104 will not maintain the conductive layer upon being subjected to reactive ion etching, while sidewall spacer fuse links will form on the vertical walls 102.

In an alternative embodiment, two or more masks may be used to form the fuse structure. For example, a first mask could define the opening 106 and a second mask could define the pad areas 108. Therefore, while the invention may include a single phase shift mask, additional regular and/or phase shift masks can be utilized depending upon the specific application being addressed.

Therefore, the invention is superior to conventional structures because it produces fuse links which have a substantially reduced cross-sectional area when compared to conventional fuse links (e.g., sub-lithographic fuse links). Thus, the inventive fuse links can be opened more easily and more predictably.

Further, the invention uses a single mask to form the fuse link areas and the non-fuse link areas. Conventionally, such structures could only be formed using additional masks such as a mask used to trim the conductive material from areas where the fuse link should not exist. The inventive phase shift mask (and sloped sidewalls it produces) in combination with the selective reactive ion etch eliminates the need for such trimming masks.

The inventive process of forming fuse links with conductive spacers provides a tighter distribution of blow voltage than what is achievable with fuses that are defined photolithographically. This allows the nominal blow voltage to be set lower, which means that the maximum voltage needed to assure that a fuse can be blown is reduced.

While the invention has been discussed above with respect to a fuse structure, as would be known by one ordinarily skilled in the art given this disclosure, the invention could also be utilized with any interconnect wiring structure. More specifically, the invention allows any interconnect wiring structure to be formed without the need for additional trimming masks. The invention allows the formation of interconnect wiring structures which are self-trimmed because they are formed with a single mask, such as the phase-shift mask discussed above.

While the invention has been described in terms of preferred embodiments, those skilled in the art will recognize that the invention can be practiced with modification within the spirit and scope of the appended claims.

What is claimed is:

1. A semiconductor structure for selectively connecting a plurality of elements, said semiconductor structure comprising:
   an insulating layer having an opening having vertical sidewalls and sloped sidewalls;
   a plurality of fuse links lining said vertical sidewalls, said fuse links selectively connecting ones of said elements.

2. The semiconductor structure in claim 1, wherein said fuse links comprise sidewall spacers on said vertical sidewalls.

3. The semiconductor structure in claim 2, wherein said opening has a minimum lithographic size and said fuse links have a width less than said minimum lithographic size.

4. The semiconductor structure in claim 1, wherein said vertical sidewalls extend continuously between ones of said elements that are connected and said sloped sidewalls are positioned between ones of said elements that are not connected.

5. The semiconductor structure in claim 1, wherein said sloped sidewalls are devoid of said fuse links.

* * * * *